US012785677B2

(12) United States Patent
Cook et al.

(10) Patent No.: US 12,785,677 B2
(45) Date of Patent: Nov. 3, 2026

(54) POWER TRANSMISSION GATE USING CHARGE PUMP

(71) Applicant: Murata Manufacturing Co., Ltd., Kyoto (JP)

(72) Inventors: Aaron Cook, Windham, NH (US); David J. Perreault, Cambridge, MA (US); John R. Hoversten, Arlington, MA (US)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 18/465,384

(22) Filed: Sep. 12, 2023

(65) Prior Publication Data

US 2024/0137018 A1 Apr. 25, 2024
US 2024/0235547 A9 Jul. 11, 2024

Related U.S. Application Data

(60) Provisional application No. 63/380,612, filed on Oct. 24, 2022.

(51) Int. Cl.

| | |
|---|---|
| ***H03K 17/00*** | (2006.01) |
| ***H02M 3/07*** | (2006.01) |
| ***H03K 17/687*** | (2006.01) |

(52) U.S. Cl.
CPC ............ *H03K 17/687* (2013.01); *H02M 3/07* (2013.01); *H03K 2217/0081* (2013.01)

(58) Field of Classification Search
CPC ............... H03K 17/687; H03K 17/063; H03K 17/6874; H03K 17/693; H02M 3/07
See application file for complete search history.

(56) References Cited

U.S. PATENT DOCUMENTS

| | | | | |
|---|---|---|---|---|
| 4,529,897 A * | 7/1985 | Suzuki | H03K 17/6872 | 327/437 |
| 6,411,531 B1 * | 6/2002 | Nork | H02M 3/073 | 363/60 |
| 7,746,041 B2 | 6/2010 | Xu et al. | | |
| 7,777,459 B2 | 8/2010 | Williams | | |
| 7,782,027 B2 | 8/2010 | Williams | | |
| 7,786,712 B2 | 8/2010 | Williams | | |
| 7,812,579 B2 | 10/2010 | Williams | | |
| 7,924,085 B2 * | 4/2011 | Guo | H03K 17/6874 | 327/404 |
| 7,940,111 B2 * | 5/2011 | Soltanian | H03K 17/6871 | 327/403 |

(Continued)

OTHER PUBLICATIONS

Taiwanese Office Action (with English translation) dated Sep. 4, 2024 for Taiwanese Patent Application No. 112138257; 18 pages.

(Continued)

*Primary Examiner* — Tuan T Lam

(74) *Attorney, Agent, or Firm* — Daly, Crowley, Mofford & Durkee, LLP

(57) ABSTRACT

Described is a power transmission gate which includes a charge pump, an NMOS transistor, and a gate driver circuit configured to power (or bias or "drive") a gate of the NMOS transistor. With this arrangement, a power transmission gate capable of achieving substantially the same resistance provided by prior art power transmission gates while having a footprint of just over one NMOS size unit is provided.

26 Claims, 6 Drawing Sheets

(56) References Cited

U.S. PATENT DOCUMENTS

| | | | | |
|---|---|---|---|---|
| 7,977,927 | B2 | 7/2011 | Williams | |
| 8,022,679 | B2 * | 9/2011 | Sachdev | H03K 17/04206 323/223 |
| 8,076,966 | B2 * | 12/2011 | Hosoda | H03K 17/145 327/390 |
| 8,212,541 | B2 | 7/2012 | Perreault et al. | |
| 8,816,659 | B2 | 8/2014 | Kim et al. | |
| 8,824,978 | B2 | 9/2014 | Briffa et al. | |
| 8,829,993 | B2 | 9/2014 | Briffa et al. | |
| 8,830,709 | B2 | 9/2014 | Perreault et al. | |
| 8,830,710 | B2 | 9/2014 | Perreault et al. | |
| 8,836,408 | B1 * | 9/2014 | den Besten | H03K 17/04163 327/551 |
| 8,860,396 | B2 | 10/2014 | Giuliano | |
| 8,896,363 | B2 * | 11/2014 | Chen | H03K 17/687 327/437 |
| 8,957,727 | B2 | 2/2015 | Dawson et al. | |
| 9,020,453 | B2 | 4/2015 | Briffa et al. | |
| 9,160,287 | B2 | 10/2015 | Briffa et al. | |
| 9,166,536 | B2 | 10/2015 | Briffa et al. | |
| 9,172,336 | B2 | 10/2015 | Briffa et al. | |
| 9,172,364 | B2 * | 10/2015 | Trampitsch | H03M 1/129 |
| 9,209,758 | B2 | 12/2015 | Briffa et al. | |
| 9,287,002 | B2 * | 3/2016 | Thomas | H03K 17/162 |
| 9,490,752 | B2 | 11/2016 | Briffa et al. | |
| 9,531,291 | B2 | 12/2016 | Perreault | |
| 9,537,456 | B2 | 1/2017 | Briffa et al. | |
| 9,755,672 | B2 | 9/2017 | Perreault et al. | |
| 9,768,731 | B2 | 9/2017 | Perreault et al. | |
| 9,768,732 | B2 | 9/2017 | Briffa et al. | |
| 9,917,517 | B1 | 3/2018 | Jiang et al. | |
| 9,979,421 | B2 | 5/2018 | Astrom et al. | |
| 10,164,577 | B2 | 12/2018 | Briffa et al. | |
| 10,193,441 | B2 | 1/2019 | Giuliano | |
| 10,389,235 | B2 | 8/2019 | Giuliano | |
| 10,658,981 | B2 | 5/2020 | Briffa et al. | |
| 10,992,265 | B2 | 4/2021 | Hoversten et al. | |
| 11,043,918 | B2 | 6/2021 | Tanaka et al. | |
| 11,191,028 | B2 | 11/2021 | Hoversten et al. | |
| 11,245,367 | B2 | 2/2022 | Garrett et al. | |
| 11,558,014 | B2 | 1/2023 | Tanaka et al. | |
| 11,637,531 | B1 | 4/2023 | Perreault et al. | |
| 11,664,727 | B2 | 5/2023 | Giuliano et al. | |
| 11,699,995 | B2 * | 7/2023 | Garg | H03K 19/01735 327/581 |
| 11,736,010 | B2 | 8/2023 | Giuliano et al. | |
| 11,757,410 | B2 | 9/2023 | Hoversten et al. | |
| 11,757,411 | B2 | 9/2023 | Tanaka et al. | |
| 2014/0093016 | A1 * | 4/2014 | Umeda | H02M 1/088 363/127 |
| 2016/0335121 | A1 * | 11/2016 | Shpigelman | G06F 9/50 |
| 2018/0331620 | A1 * | 11/2018 | Vlasenko | H02M 3/073 |
| 2021/0385752 | A1 | 12/2021 | Hoversten et al. | |
| 2022/0103066 | A1 | 3/2022 | Chen et al. | |
| 2022/0149725 | A1 | 5/2022 | Garrett et al. | |
| 2023/0054485 | A1 | 2/2023 | Hoversten et al. | |
| 2023/0056740 | A1 | 2/2023 | Perreault et al. | |
| 2023/0057037 | A1 | 2/2023 | Hoversten et al. | |

OTHER PUBLICATIONS

Cao, et al.; "A Family of Zero Current Switching Switched-Capacitor DC-DC Converters"; 2010 Twenty-Fifth Annual IEEE Applied Power Electronics Conference and Exposition (APEC); Feb. 21-25, 2010; 8 Pages.

Cao, et al.; "Multiphase Multilevel Modulator DC-DC Converter for High-Current High-Gain TEG Application"; IEEE Transactions on Industry Application; vol. 47; No. 3; May/Jun. 2011; 9 Pages.

Chen, et al.; "A High Efficiency High Power Step-Up Resonant Switched-Capacitor"; 2012 IEEE Energy Conversion Congress and Exposition (ECCE); Sep. 15-20, 2012; 5 Pages.

Shoyama, et al.; "Resonant Switched Capacitor Converter with High Efficiency"; 2004 35$^{th}$ Annual IEEE Power Electronics Specialists Conference; 2004; 7 Pages.

Sun, et al.; "High Power Density, High Efficiency System Two-Stage Power Architecture for Laptop Computers"; 2006 37th IEEE Power Electronics Specialists Conference; Jun. 18-22, 2006; 7 Pages.

Unknown; "Fundamentals of Power Electronics"; Chapter 19: Resonant Conversion; Sep. 19, 2019; 87 Pages.

Yeung, et al.; "Multiple and Fractional Voltage Conversion Ratios for Switched-capacitor Resonant Converters"; 2001 IEEE 32nd Annual Power Electronics Specialists Conference (IEEE Cat. No.01CH37230); Jun. 17-21, 2001; 6 Pages.

Taiwanese Notice of Allowance (with English Translation) dated _Feb. 11, 2025 for Taiwanese Application No. 112138257; 3 Pages.

Korean Office Action dated May 13, 2025, for Korean Patent Application No. 10-2023-0139162; 18 pages w/English translation.

Korean Office Action dated May 13, 2025, for Korean Patent Application No. 10-2023-0139162; Response filed Jul. 1, 2025; 32 pages w/English translation.

Request for Amendment filed Aug. 28, 2025, for Taiwan Patent Application No. 114117586; 9 pages w/English translation.

Notice of Allowance and Allowed Claims dated Sep. 13, 2025, for Korea Patent Application No. 10-2023-0139162; 14 pages w/English translation.

Request for Amendment filed Dec. 5, 2025, for Taiwan Patent Application No. 114117586; 9 pages w/English translation.

* cited by examiner

POWER TRANSMISSION GATE USING CHARGE PUMP

CROSS REFERENCE SECTION

This application claims the benefits of U.S. Provisional Application No. 63/380,612, filed on Oct. 24, 2022. The entire contents of this application is incorporated herein by reference.

This disclosure relates generally to power transmission gates, and more particularly to power transmission gates using a charge pump.

BACKGROUND

Conventional transmission gates include an n-channel metal oxide semiconductor field effect transistor (MOSFET) and a p-channel MOSFET in which a substrate terminal is not connected internally to a source terminal. The pair of transistors are connected in parallel with the drain and source terminals of the two transistors connected together. The gate terminals are connected to each other by an inverter to form a control terminal. A parasitic substrate diode exists between source/drain and substrate. The substrate terminals are connected to respective supply potentials to ensure the parasitic substrate diode is always reversely biased and so does not affect signal flow. The substrate terminal of the p-channel MOSFET is thus connected to the positive supply potential, and the substrate terminal of the n-channel MOSFET connected to the negative supply potential. For the p-channel MOSFET to achieve the same resistivity as the n-channel MOSFET, the area of the p-channel MOSFET must be approximately twice the area of n-channel MOSFET.

BRIEF DESCRIPTION OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein Like reference numerals designate corresponding parts throughout the different views. Furthermore, embodiments are illustrated by way of example and not limitation in the figures, in which.

SUMMARY

Figure 1:
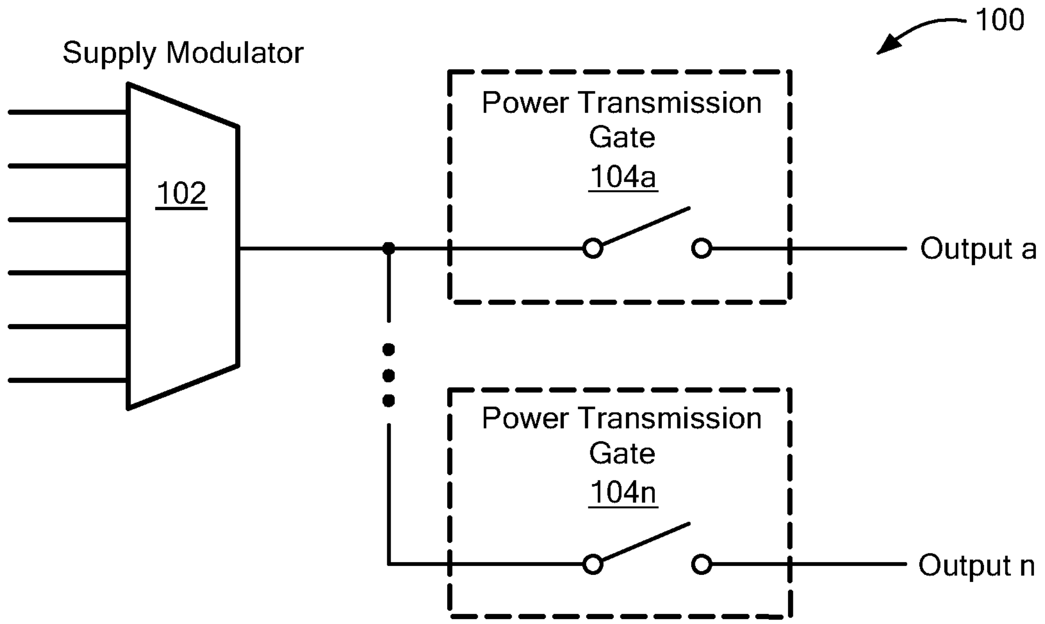
FIG. 1 Prior Art
FIG. 1 is a block diagram of an exemplary prior art supply modulation system that includes a plurality of power transmission gates.

Described is a power transmission gate which includes a charge pump, an NMOS transistor, and a gate driver circuit configured to power (or bias or "drive") a gate of the NMOS transistor. With this arrangement, a power transmission gate capable of achieving substantially the same resistance provided by prior art power transmission gates while having a footprint of approximately just over one NMOS size unit is provided. Moreover, transmission gates provided in accordance with the concepts described herein may have a lower resistance per unit area and/or a lower overall parasitic capacitance compared with conventional transmission gates In embodiments a power transmission gate includes a switch having an input terminal, an output terminal, a control terminal, and a body terminal, the switch configured to receive an input voltage at the input terminal thereof and, in response to a control signal having a first value being provided to the control terminal, pass the input voltage to the output terminal of the switch; and a first capacitance between the input and control terminals of the switch and configured to maintain a substantially constant voltage across the input and control terminals of the switch; and a charge pump coupled to the control terminal of the switch, wherein in response to the charge pump receiving an input voltage, the charge pump applies a drive voltage to the control terminal of the switch, wherein a voltage level of the drive voltage is larger than a voltage level of the input voltage.

The power transmission gate may include one or more of the following features independently or in combination with one or more other features to include: a voltage source selectively coupled to the control terminal of the switch; the charge pump includes a capacitor configured to charge a gate of the switch to about twice the input voltage; the charge pump comprises a switch network that is connected to a capacitor configured to charge a gate of the switch to about twice the input voltage; a switch network configured to operate at a variable clock frequency; a switch network configured to operate at a variable clock frequency having a relatively high value during an initial turn-on of the switch, and configured to reduce in value after a particular period of time; the switch is an NMOS transistor; the charge pump has a Disckson or Pelliconi topology; the power transmission gate satisfies one or more safe operating area conditions of an NMOS transistor; the power transmission gate is configured to carry currents in the order of amperes; the power transmission gate is configured to respond to changes in the input voltage that occur in the order of nanoseconds.

In embodiments, the switch may be provided as n-channel metal oxide semiconductor field effect transistor (n-channel MOSFET) the input terminal of the switch is a source terminal of the n-channel MOSFET, the output terminal of the switch is a drain terminal of the n-channel MOSFET, the control terminal of the switch is a gate terminal of the n-channel MOSFET.

In embodiments, a voltage source is configured to apply a voltage to the control terminal of the switch having a value equal to about a maximum possible voltage for the input voltage; and the voltage at the control terminal of the switch changes proportionally with respect to the input voltage changing between zero volts and the maximum possible voltage for the input voltage.

In embodiments, the power transmission gate may include a switch network is configured to protect a gate-source breakdown voltage of a diode of the charge pump.

In embodiments, the power transmission gate may include a second capacitor with first capacitor having a larger capacitance value than the second capacitor.

In embodiments, the power transmission gate may further include a shutdown circuit having a terminal coupled to the control terminal of the switch and configured to discharge the voltage at the control terminal of the switch when the switch is disabled.

In embodiments, the power transmission gate is a pulse shaping network switch.

In embodiments, the power transmission gate includes a body control circuit that is configured to control a body of the switch.

In embodiments, the power transmission gate includes a body control circuit which includes a first NMOS transistor that is configured to drive the body of the switch to the input voltage when the switch is enabled; and a second NMOS transistor that is configured to drive the body of the switch to a negative supply voltage when the switch is disabled.

In accordance with a further aspect of the concepts described herein, a system includes the power transmission gate and a supply modulator configured to provide, from a set of possible input voltage levels, the input voltage to the power transmission gate.

In embodiments, the supply modulator is configured to provide, from the set of possible input voltage levels, the input voltage to at least one additional power transmission gate.

In embodiments, the power transmission gate is electrically isolated from the at least one additional power transmission gate.

It should be appreciated that individual elements of different embodiments described herein may be combined to form other embodiments not specifically set forth above. Various elements, which are described in the context of a single embodiment, may also be provided separately or in any suitable or reasonable sub-combination. It should also be appreciated that other embodiments not specifically described herein are also within the scope of the following claims. It should thus be appreciated that the concepts, circuits, systems and techniques described herein could be used in any application where the following conditions are met: a voltage is passed from input to output; and/or a higher voltage rail exists that is equal to or greater than the maximum input voltage. The concepts, circuits, systems and techniques described herein can be applied in a wide variety of different technology areas (i.e., different nodes) and/or at different voltages.

DETAILED DESCRIPTION

In power transmission and/or envelope tracking applications, a plurality of power transmission gates (which can include "pulse shaping network switches" that are used in RF applications with a filtering network) can be used to provide electrical isolation between a plurality of outputs (e.g., one or more signal paths leading from one or more supply modulator outputs to one or more supply terminals of a power amplifier, for example). Exemplary pulse shaping networks and their associated switches/switch elements are described in U.S. patent application Ser. No. 16/369,667 entitled "MULTI-STAGE PULSE SHAPING NETWORK", filed Mar. 29, 2019, now U.S. Pat. No. 10,992,265, issued Apr. 27, 2021, the entire contents of which are hereby incorporated by reference herein.

These power transmission gates may be coupled to one or more outputs of a supply modulator (i.e., power transmission gates can follow a supply modulator). A supply modulator may be configured to provide, from a set of possible input voltage levels, one or more selected output voltage levels at one or more outputs thereof. Each of the power transmission gates can pass the selected output voltage level to a respective output thereof. The power transmission gate outputs may, for example, be coupled to a supply terminal of a power amplifier (PA).

Referring now to FIG. 1, a block diagram of an exemplary prior art supply modulation system 100 includes a supply modulator 102 configured to receive a plurality of input voltages (in this example, six) and provide a selected one of the plurality of input voltages to an output. The output of the supply modulator 102 is coupled to a plurality of power transmission gates 104*a-n*. The power transmission gates 104*a-n* are each configured to receive the selected one of the plurality of input voltages from the output of the supply modulator 102 and pass that voltage to a respective output.

The power transmission gates 104*a-n* may be configured to satisfy one or more criteria for the particular application. For example, the power transmission gates 104*a-n* can be configured to respond relatively quickly (e.g., in the order of nanoseconds) to changes in the input voltages because the output of the supply modulator 102 can change in nanoseconds. Further, the power transmission gates 104*a-n* can be configured to provide electrical isolation between their respective outputs. The power transmission gates 104*a-n* can also be configured to have relatively low resistances and carry relatively large currents (e.g., in the order of amperes). In some implementations, the power transmission gates 104*a-n* can be configured to carry currents having values of about 2 amperes at a voltage of about 4.6 volts, although other applications having larger voltages and/or currents are possible as well. In some implementations, the power transmission gates 104*a-n* can be configured to operate at a maximum power of about 10 watts, although other applications having larger power limits are possible as well. In some implementations, the power transmission gates 104*a-n* can each have a relatively low resistance (e.g., of about 30 milliohms).

Traditionally, to achieve one or more of these criteria, the power transmission gates 104*a-n* would be required to have a particular size (i.e., an area (or "footprint") occupied on an IC or a die by the power transmission gate) determined by the types of components required to achieve the criteria.

Figure 2:
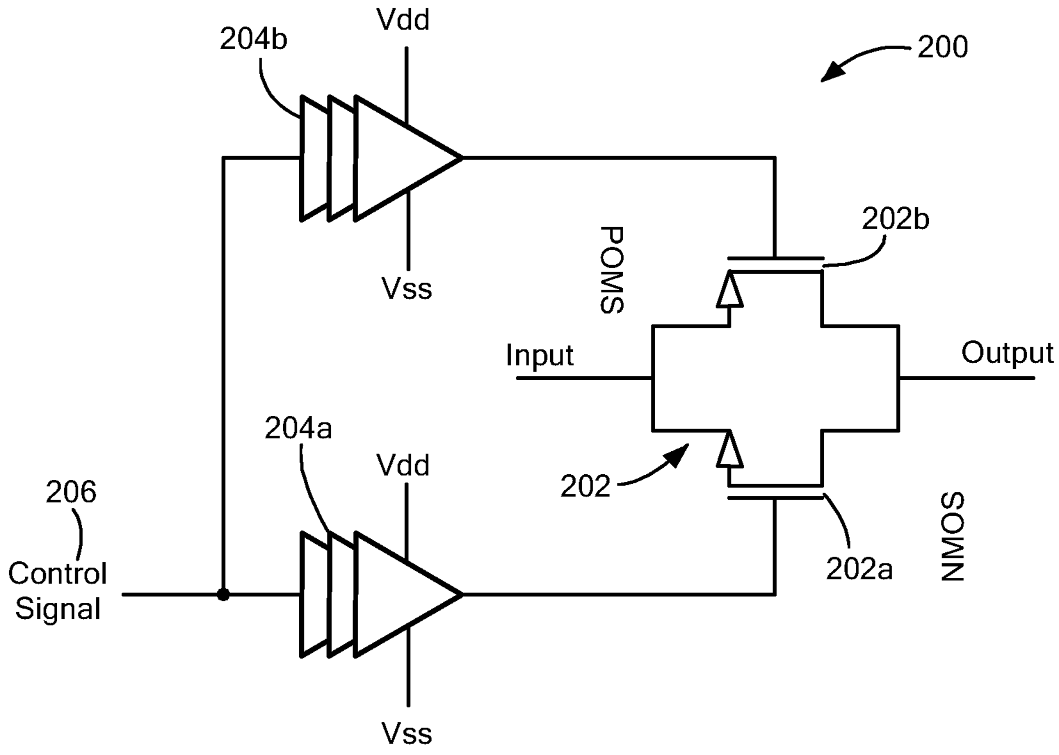
FIG. 2 Prior Art
FIG. 2 is a block diagram of an exemplary prior art power transmission gate of FIG. 1.

FIG. 2 is a block diagram of an exemplary prior art power transmission gate 200. The power transmission gate 200 may be an example of the power transmission gates 104*a-n* of FIG. 1. The power transmission gate 200 includes an NMOS transistor 202*a* and a PMOS transistor 202*b* that form a complementary switch pair 202. The complementary switch pair 202 is configured to receive an input voltage (e.g., from a supply modulator) and pass or block the received voltage to/from an output.

The power transmission gate 200 includes a first amplifier 204*a* that is configured to power a gate of the NMOS transistor 202*a* and a second amplifier 204*b* that is configured to power a gate of the PMOS transistor 202*b*. The amplifiers 204*a*, 204*b* operate according to a control signal 206. Each of the amplifiers 204*a*, 204*b* is configured to receive a negative power supply Vss and a positive power supply Vdd. The input voltage received by the complementary switch pair 202 can be between the voltages provided by the negative power supply Vss and the positive power supply Vdd.

To achieve the same resistance as the NMOS transistor 202*a*, the PMOS transistor 202*b* typically must be about twice the size (i.e., occupy twice the area on a die or an IC) of the NMOS transistor 202*a*. Thus, the power transmission gate 200 can be said to have a size of about "three NMOS size units" (e.g., one NMOS transistor 202*a* that counts as one NMOS size unit, and one PMOS transistor 202*b* that counts as two NMOS size units). In many applications, it would be desirable to reduce the overall size (or footprint) of power transmission gates while satisfying the criteria described above.

Figure 3A:
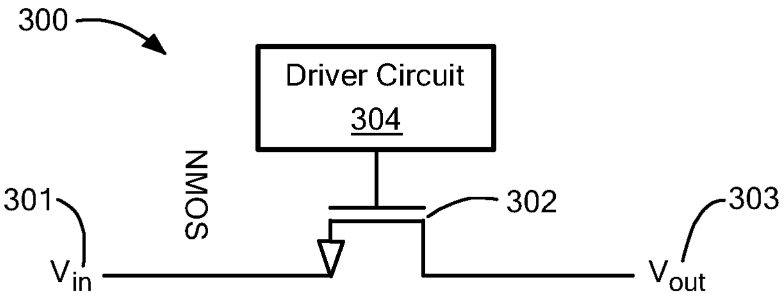
FIGS. 3A and 3B are block diagrams of an exemplary power transmission gate provided in accordance with the concepts described herein.

FIG. 3A is a block diagram of an exemplary power transmission gate 300 provided in accordance with the concepts described herein. The power transmission gate 300 can be configured to achieve the same resistance provided by the prior art power transmission gate 200 of FIG. 2 while having a footprint of just over one NMOS size unit. The power transmission gate 300 includes an NMOS transistor 302 and a gate driver circuit 304 (e.g., a high voltage gate driver circuit) configured to power (or bias or "drive") a gate of the NMOS transistor 302 while satisfying the criteria described above. The NMOS transistor 302 is configured to receive an input voltage $V_{in}$ 301 (e.g., from a supply modulator) at a first (or input) terminal thereof and pass or block the received input voltage $V_{in}$ to/from a second (or output) terminal thereof, thereby providing an output voltage $V_{out}$ 303. That is, when NMOS transistor 302 is biased into its conducting state (or ON state), NMOS transistor 302 provides a signal path having a relatively low resistance (and ideally a short circuit resistance) between the input and the output terminals of NMOS transistor 302. In this state, a signal can pass with little (or ideally no) loss from the first (or input) terminal of NMOS transistor 302 to the second (or output) terminal of NMOS transistor 302. However, when NMOS transistor 302 is biased into its non-conducting state (or OFF state), NMOS transistor 302 provides a signal path having a relatively high resistance (and ideally an open circuit resistance) between the input and the output terminals of NMOS transistor 302. In this state, a signal cannot pass (or is highly attenuated) from the first (or input) terminal of NMOS transistor 302 to the second (or output) terminal of NMOS transistor 302.

Figure 3B:
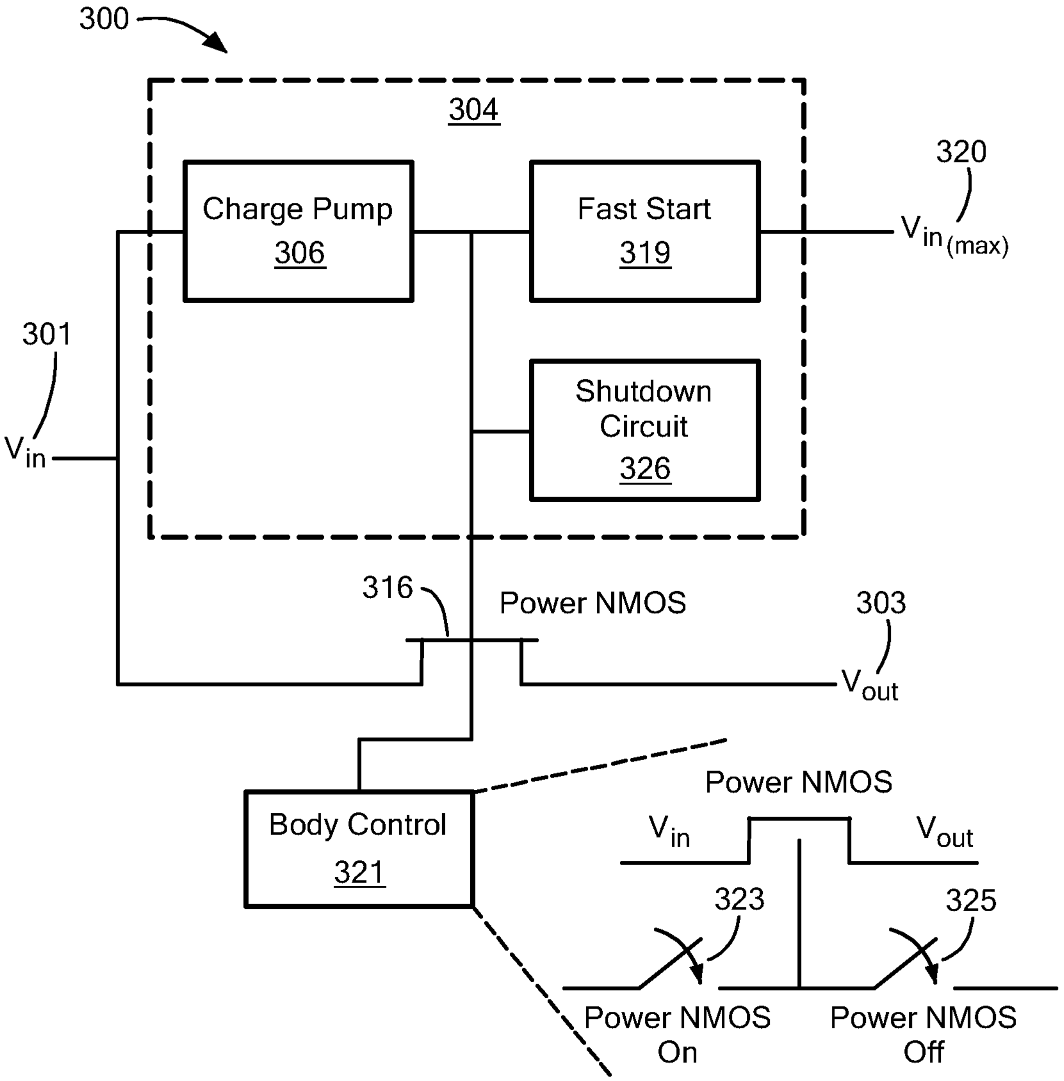

FIG. 3B is another block diagram of the exemplary power transmission gate 300 provided in accordance with the concepts described herein. In this example, further details of the gate driver circuit 304 are provided. In this example, the gate driver circuit 304 includes a charge pump 306 configured to receive the input voltage $V_{in}$ 301. The charge pump 306 is coupled to a control terminal (e.g., a body terminal) of a switch 316 (e.g., a power NMOS). The charge pump 306 is configured to apply a drive voltage to the control terminal of the switch 316. The voltage level of the drive voltage is larger than a voltage level of the input voltage $V_{in}$ 301. The charge pump 306 can include a switch network for selectively coupling a capacitor to the control terminal of the switch 316 such that the gate can be charged to about twice the input voltage $V_{in}$ 301. Details of an exemplary charge pump 406 are described herein with respect to FIG. 4.

The gate driver circuit 304 includes a fast start circuit 319 that is configured to receive a maximum possible input voltage $V_{in(max)}$ 320 from an external voltage source and selectively apply the maximum possible input voltage $V_{in(max)}$ 320 to the control terminal of the switch 316. The fast start circuit 319 can include one or more components and/or configurations for selectively applying the maximum possible input voltage $V_{in(max)}$ 320 to the gate of the switch 316. Details of an exemplary fast start circuit 419 are described herein with respect to FIG. 4.

The gate driver circuit 304 includes a shutdown circuit 326 that is coupled to the control terminal of the switch 316. The shutdown circuit 326 can include a switch that is responsive to a shutdown signal. The switch can have a drain coupled to the gate of the switch 316 and can be configured to discharge the voltage at the gate of the switch 316 when the switch 316 is disabled. Details of exemplary shutdown circuits 426, 526 are described herein with respect to FIGS. 4 and 5.

The power transmission gate 300 includes a body control circuit 321 that is configured to control a body of the switch 316. When the switch 316 is enabled, the body can be tied to the input voltage $V_{in}$ 301, and when the switch 316 is disabled, the body can be tied to a negative supply voltage (e.g., $V_{ss}$, or ground). The body control circuit 321 can include a first power NMOS transistor 323 and a second power NMOS transistor 325. In some implementations, the first power NMOS transistor 323 is configured to drive the body to the input voltage $V_{in}$ 301 when the switch 316 is enabled, and the second power NMOS transistor 325 is configured to drive the body to the negative supply voltage $V_{ss}$ when the switch 316 is disabled.

While a single power transmission gate 300 is shown, it should be understood that multiple power transmission gates may be provided such that each power transmission gate receives one of a plurality of input voltage or in some instances the same input voltage $V_{in}$, and provides a respective output voltage.

The power transmission gate 300 can be configured to concurrently satisfy one or more criteria, including, but not limited to satisfying one or more safe operating area conditions of the NMOS transistor 302 (e.g., max Vgs, Vds, Vdb, Vds, etc.) such as: being configured to respond relatively quickly (e.g., in the order of nanoseconds) to changes in the input voltages; being configured to provide electrical isolation between the various outputs; being configured to carry relatively large currents (e.g., in the order of amperes), etc.

Figure 4:
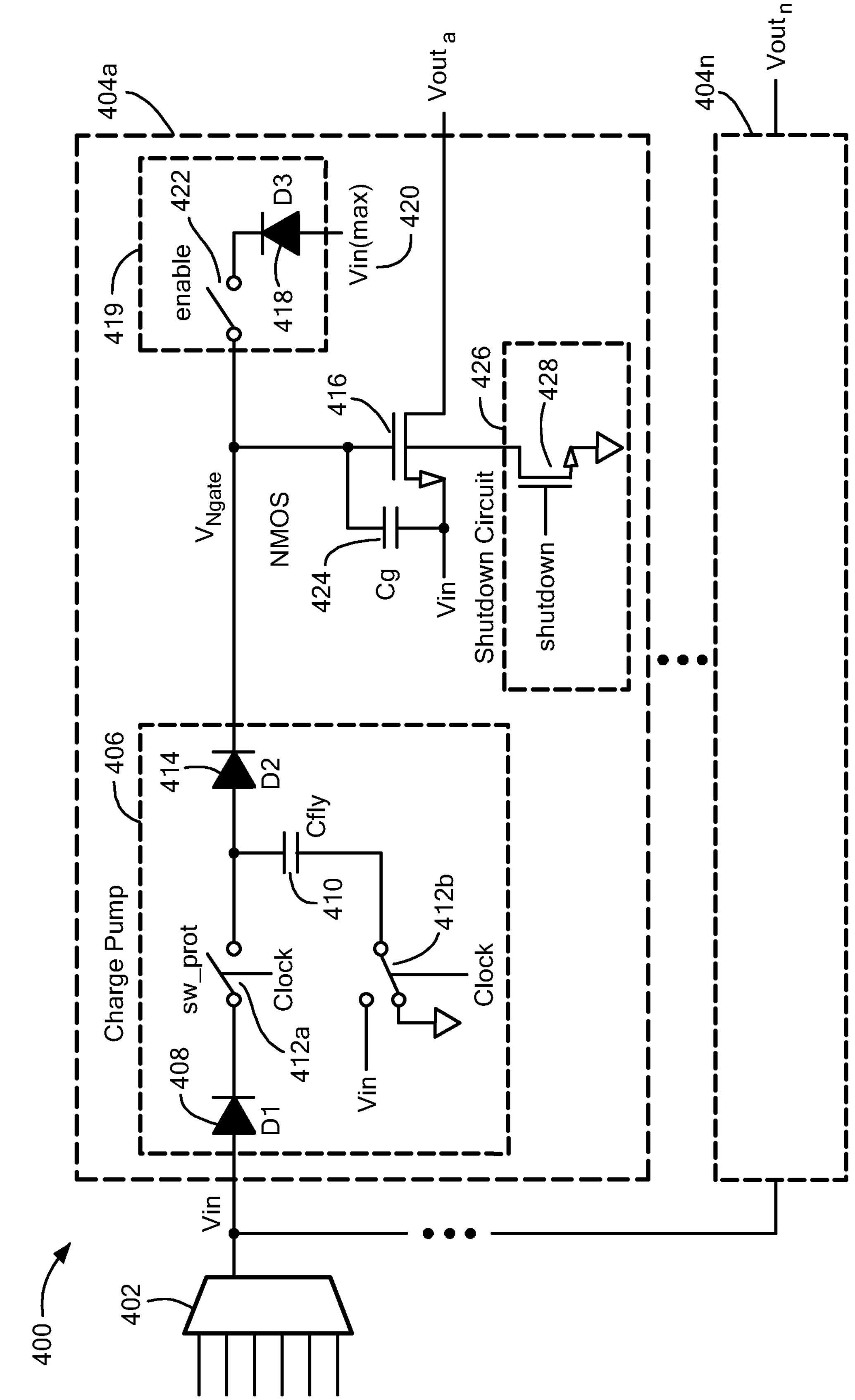
FIG. 4 is a schematic diagram of an exemplary supply modulation system that includes power transmission gates provided in accordance with the concepts described herein.

FIG. 4 is a schematic diagram of an exemplary supply modulation system 400 that includes at least one power transmission gate 404*a* (and, in some examples, a plurality of power transmission gates 404*a-n*) provided in accordance with the concepts described herein. The power transmission gate 404*a* may be an example of the power transmission gate 300 of FIG. 3. Each of the power transmission gates 404*a-n* includes a gate driver circuit that is configured to power (or bias or "drive") a gate of a switch 416.

The supply modulation system 400 includes a supply modulator 402 configured to provide, from a set of possible input voltage levels, an input voltage $V_{in}$ to one or more power transmission gates 404*a*-404*n*. Taking power transmission gate 404*a* as representative of power transmission gates 404*a*-404*n*, power transmission gate 404*a* includes a charge pump 406 configured to receive the input voltage $V_{in}$ from the supply modulator 402. The input voltage $V_{in}$ is received at a first terminal (e.g., an input) of a diode 408 of the charge pump 406, and a second terminal (e.g., an output) of the diode 408 is coupled to a first terminal (a "top end") of a flying capacitor $C_{fly}$ 410 via a switch 412*a*. The switch 412*a* is configured to protect a breakdown of the diode D1 408 from a source-to-gate voltage (Vgs). The input voltage $V_{in}$ (e.g., from the supply modulator 402) is selectively applied through a switch 412*b* to a first terminal (or "bottom end") of the flying capacitor $C_{fly}$ 410. The switches 412*a*, 412*b* can generally belong to a switch network 412. A second terminal (or "top end") of flying capacitor $C_{fly}$ 410 is coupled to an input of a diode 414. Voltage signals passing through diode 414 may correspond to a drive (or control) voltage provided to a control terminal of a switch 416. In this example, switch 416 is provided as an NMOS transistor and the control terminal corresponds to a gate terminal of the NMOS transistor which receives a voltage $V_{Ngate}$.

The diodes 408, 414, flying capacitor $C_{fly}$ 410, and the switches 412*a*, 412*b* operate in a manner such that the flying capacitor $C_{fly}$ 410 is configured to charge the gate of the switch 416 to the drive voltage $V_{Ngate}$ having a value greater than the input voltage $V_{in}$, which, in this example, is about two times the input voltage $V_{in}$. The switch 412*b* is configured to switch between the input voltage $V_{in}$ and a reference potential (illustrated as ground in this example embodiment) such that the input voltage and the reference potential are alternately applied to the bottom end of the flying capacitor $C_{fly}$ 410. The switch 412*a* is configured to switch between applying and disconnecting the output of the diode 408 from the top end of the flying capacitor $C_{fly}$ 410.

The power transmission gate 404*a* includes a diode D3 418 that receives at a first (or input) terminal thereof a voltage provided by an external voltage source 420. In embodiments, the external voltage source 420 may, for example, be an external rail of the system 400. The voltage provided by external voltage source 420 may have a value corresponding to about a maximum possible input voltage $V_{in(max)}$ that the input voltage $V_{in}$ can be. A second (or output) terminal of diode D3 418 is selectively coupled to the control terminal (here the gate terminal) of the switch 416 via a switch 422. The diode D3 418 is configured to ensure that the drive voltage $V_{Ngate}$ applied to the gate of the switch 416 is always above $V_{in(max)}$ when enabled. While a diode D3 418 is shown, it should be understood that other components and/or configurations are also possible for selectively applying the external voltage source 420 to the gate of the switch 416. The external voltage source 420 and the other components for allowing it to be selectively applied are sometimes collectively referred to herein as belonging to a "fast start circuit."

The switch 416 is configured to receive the input voltage from the supply modulator 402 at a source of the switch and pass the input voltage to a drain of the switch. A capacitance $C_g$ 424 is coupled between the gate and the source of the switch 416 and configured to maintain a substantially constant voltage across the gate and the source. The capacitance $C_g$ 424 can have a larger (e.g., significantly larger, in some implementations, 10-100 times larger) capacitance value than the flying capacitor $C_{fly}$ 410. In some implementations, the ratio of the values between the capacitance $C_g$ 424 and the flying capacitor $C_{fly}$ 410 can be chosen to ensure that the capacitance $C_g$ 424 can allow the gate of the switch 416 to track the source of the switch 416 as the input voltage $V_{in}$ is modulated.

The capacitance $C_g$ 424 represents one or more internal parameters of the switch 416. For example, the capacitance $C_g$ 424 can represent several physical capacitances/capacitors within the switch 416, including but not limited to a gate-to-source capacitance $C_{gs}$ and a gate-to-drain capacitance $C_{gd}$, In some implementations, the capacitance $C_g$ 424 may be augmented by one or more physical capacitors/capacitances implemented in the power transmission gates 404*a-n*.

In a first startup case, the switch 416 turns from off to on with the input voltage $V_{in}$ at its maximum voltage $V_{in(max)}$. The drive voltage $V_{Ngate}$ is quickly (or rapidly) charged to the maximum input voltage $V_{in(max)}$ through the diode D3 418. In some implementations, the drive voltage $V_{Ngate}$ is charged at a rate of about 1 volt per nanosecond, although other rates (e.g., in some cases faster rates) are also possible. Over a relatively short period of time, flying capacitor $C_{fly}$ 410 is charged such that drive voltage $V_{Ngate}$ corresponds to about two times the input voltage $V_{in}$. In some implementations, the flying capacitor $C_{fly}$ 410 is charged at a rate of about 200 kHz, although other rates are also possible, including programmable/configurable rates. The voltage across the gate and the source (i.e., the gate-source voltage Vgs) of NMOS transistor 416 is equal to the input voltage $V_{in}$, which is equal to the maximum input voltage $V_{in(max)}$. At this point, the switch 416 is fully enhanced and can conduct. If the input voltage $V_{in}$ suddenly drops, the drive voltage $V_{Ngate}$ follows that same drop proportionally because it is coupled through the capacitance $C_g$ 424. Due to this coupling, the voltage $V_{gs}$ across the gate and the source of switch 416 is maintained at a substantially consistent value as the input voltage $V_{in}$ changes. This can ensure that safe operating conditions of the switch 416 (e.g., max Vgs, Vds, Vdb, Vds, etc.) are not violated.

In a second startup case, with the input voltage $V_{in}$ at zero, the charge pump 406 has no input voltage, so it is essentially doing nothing. In this situation, the external voltage source 420 via the diode D3 418 is configured to charge the gate of the switch 416 to $V_{in(max)}$, which enhances the switch 416. At this point, the voltage $V_{gs}$ across the gate and the source of the switch 416 has a value of $V_{in(max)}$ If the input voltage $V_{in}$ suddenly increases, the capacitance $C_g$ 424 keeps the drive voltage $V_{Ngate}$ coupled to the input voltage $V_{in}$ such that the voltage $V_{gs}$ across the gate and the source of the switch 416 remains substantially constant at a value of about $V_{in(max)}$.

In both use cases, the voltage $V_{gs}$ across the gate and the source of the switch 416 is kept close to $V_{in(max)}$ regardless of how the input voltage $V_{in}$ changes. There is a phase when the gate of the switch 416 is initially charged, and then from there the coupling of the capacitance $C_g$ 424 keeps the gate moving with the source.

In some implementations, the charge pump 406 is a Dickson charge pump. The charge pump 406 can be configured to operate at a variable clock speed. For example, during an initial turn-on of the switch 416, the clock frequency for the charge pump can be run at a relatively high rate. After a fixed period of time, the clock frequency can be reduced, in some cases significantly. In some implementations, the fixed period of time may be determined at least in part by the charging rate of the flying capacitor $C_{fly}$ 410 into the capacitance $C_g$ 424 coupled to the switch 416.

The power transmission gate 404*a* also includes a shutdown circuit 426. The shutdown circuit 426 includes a switch 428 (e.g., an NMOS transistor) that is responsive to a shutdown signal. The switch 428 has a drain coupled to the gate of the switch 416 and is configured to discharge the voltage at the gate of the switch 416 when the switch 416 is disabled. The shutdown circuit 426 may include additional components than those shown in FIG. 4. As such, the shutdown circuit 426 may be considered a simplified version of a shutdown circuit. Another example of a shutdown circuit that includes additional components is described herein with respect to FIG. 5.

The supply modulation system 400 can include additional power transmission gates 404*a-n*, with each of the power transmission gates 404*a-n* being configured to receive the input voltage $V_{in}$ from the supply modulator 402 and provide a respective output $Vout_{a-n}$. Each of the outputs $Vout_{a-n}$ can be electrically isolated for each other.

While the charge pump 406 has been illustrated and described as having a Dickson topology, other topologies can also be used without departing from the scope of the inventive concepts described herein. In some implementations, a charge pump having a Pelliconi topology could be used.

Figure 5:
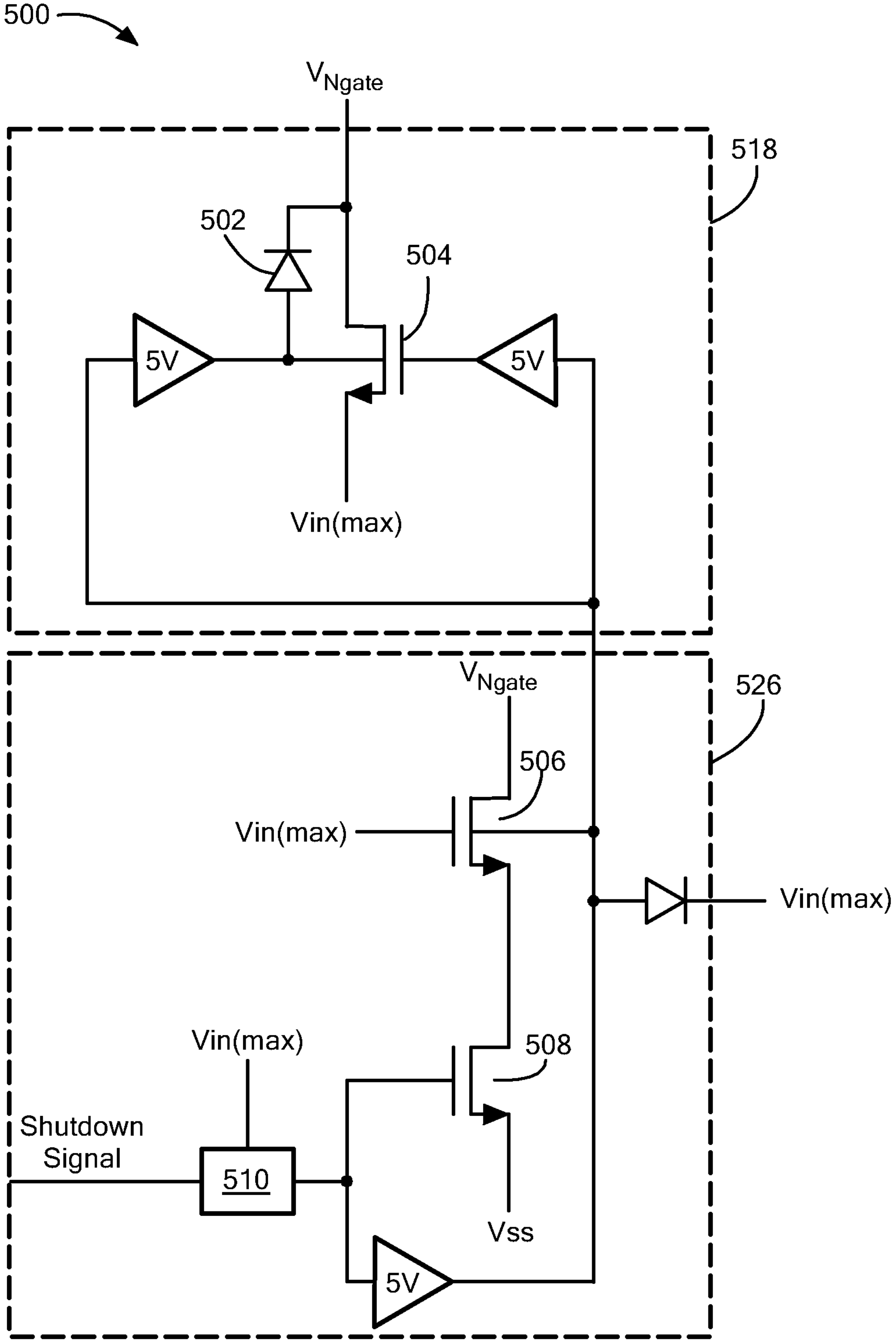
FIG. 5 is a schematic diagram of a portion of a power transmission gate that includes an exemplary shutdown circuit that is configured for use with the power transmission gates provided in accordance with the concepts described herein.

FIG. 5 is a schematic diagram of a portion of a power transmission gate 500 that includes an exemplary shutdown circuit 526 that is configured for use with the power transmission gates provided in accordance with the concepts described herein. The shutdown circuit 526 may be an example of the shutdown circuit 426 of FIG. 4.

The power transmission gate 500 includes a diode 518 that is configured to initially charge $V_{Ngate}$ to $V_{in(max)}$ and ensure that $V_{Ngate}$ never drops below $V_{in(max)}$. The diode 518 may be an example of the diode 418 of FIG. 4. The diode 518 includes a buffer 502 that is configured to maintain a body of a switch 504 at an appropriate potential.

The power transmission gate 500 includes a protection switch 506 and a discharge switch 508. Each of the protection switch 506 and the discharge switch 508 may be NMOS transistors. The protection switch 506 is configured to provide protection to the discharge switch 508 from the relatively high voltage seen at $V_{Ngate}$. The power transmission gate 500 also includes a level translator 510 that is configured to receive a shutdown signal and up convert a logic level signal to the $V_{in(max)}$ domain. The power transmission gate 500 also includes a plurality of buffers and inverters that are generally configured to drive the gates and bodies of the various components of the power transmission gate 500.

Figure 6:
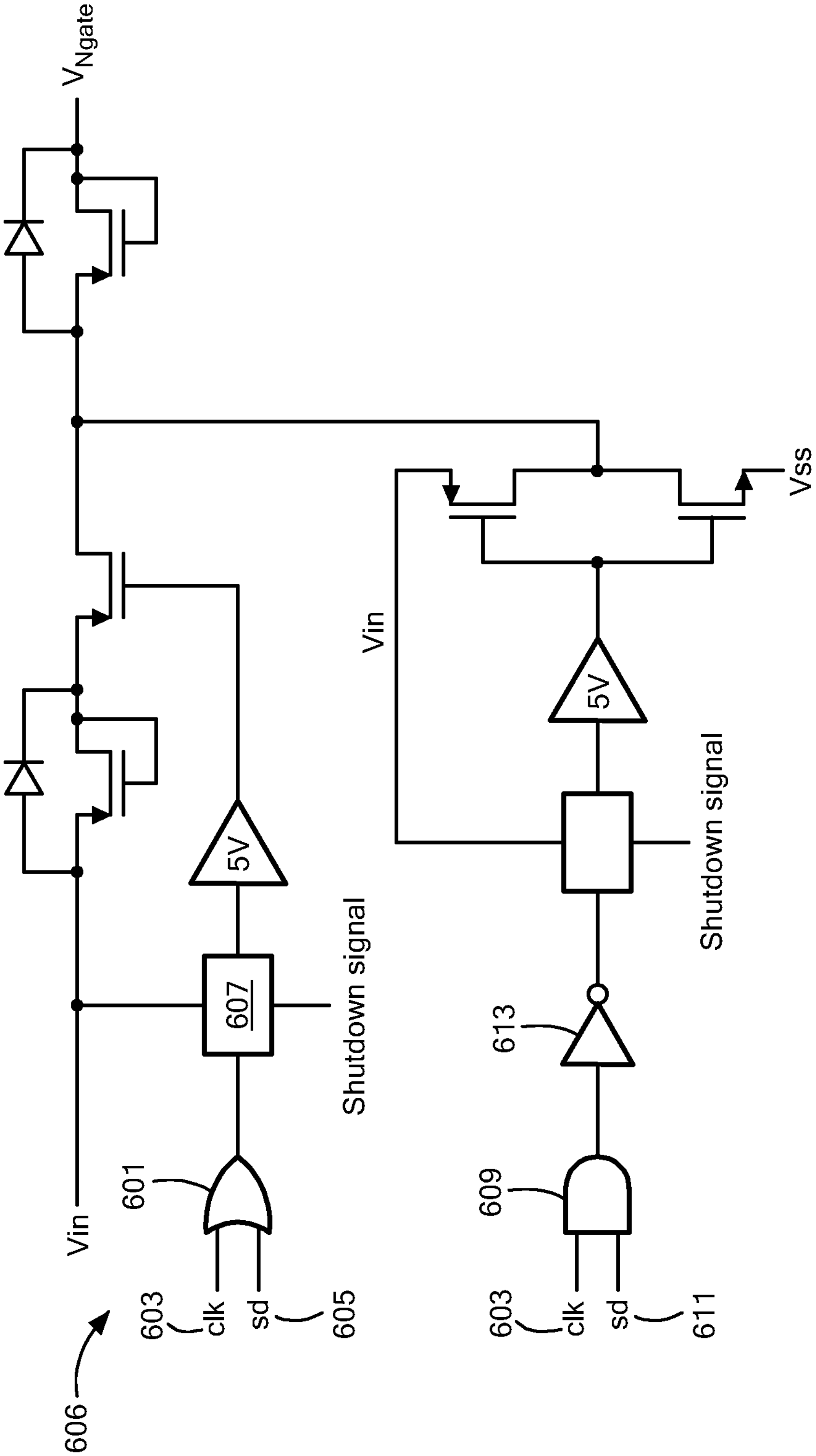
FIG. 6 is a schematic diagram of an exemplary charge pump that is configured for use with the power transmission gates provided in accordance with the concepts described herein.

FIG. 6 is a schematic diagram of an exemplary charge pump 606 that is configured for use with the power transmission gates provided in accordance with the concepts described herein. In this example, the charge pump 606 has a Dickson topology. The charge pump 606 may be an example of a type of charge pump suitable for use in the embodiment FIG. 4 (i.e., charge pump 606 may be the same as or similar to charge pump 406 of FIG. 4).

The charge pump 606 is configured to provide charge from the input voltage $V_{in}$ to the driver voltage $V_{Ngate}$. Level translation is performed by the charge pump 606 to convert low level signals (e.g., 1.8 volt signals) to the input voltage $V_{in}$ level. The charge pump 606 includes an OR gate 601 that is configured to receive a clock signal 603 and a shutdown signal 605 as inputs and provide an output to a first level translator 607, and an AND gate 609 that is configured to receive the clock signal 603 and an enable signal 611 (e.g., which is the inverse of the shutdown signal 605) as inputs and provide an output to a second level translator 613. The first and second level translators 607, 613 are each configured to receive a shutdown signal, which may be the same as the shutdown signal 605 received by the OR gate 601.

Figure 7:
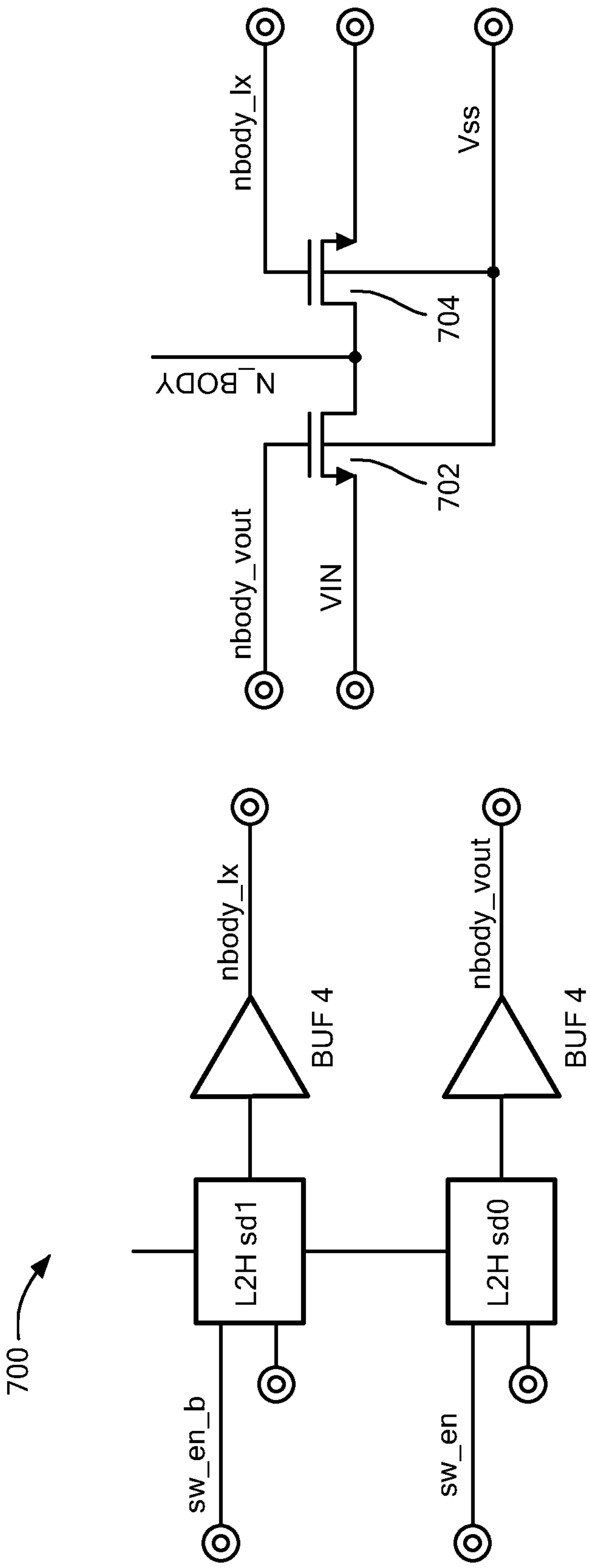
FIG. 7 is a schematic diagram of an exemplary body control circuit that is configured for use with the power transmission gates provided in accordance with the concepts described herein.

FIG. 7 is a schematic diagram of an exemplary body control circuit 700 that is configured for use with the power transmission gates provided in accordance with the concepts described herein. For example, the body control circuit 700 may be used to control a body of a switch, such as the switch 416 of FIG. 4. When the switch is enabled, the body can be tied to the input voltage $V_{in}$, and when the switch is disabled, the body can be tied to a negative supply voltage $V_{ss}$ (e.g., ground).

The body control circuit 700 can be configured to avoid the body effect of the resistance of the switch increasing as the source and drain voltages increase above the body voltage. For example, the particular voltage that the body is at changes the threshold/degree at which the gate voltage will enable/enhance the switch. As such, for a given gate voltage, as the body voltage increases, the resistance of the switch increases. To avoid the body effect, the body control circuit 700 can include a first NMOS transistor 702 that is configured to drive the body to the input voltage $V_{in}$ when the switch is enabled, and a second NMOS transistor 704 that is configured to drive the body to the negative supply voltage $V_{ss}$ (e.g., ground) when the switch is disabled. Such a configuration can prevent back conducting through the body diode (e.g., keeping the output at a relatively high resistance).

Although reference is sometimes made herein to particular structures, circuit elements and materials, it is appreciated that other structures, circuit elements and materials having similar functional and/or structural properties may be substituted where appropriate, and that a person having ordinary skill in the art would understand how to select such materials and incorporate them into embodiments of the concepts, techniques, and structures set forth herein without deviating from the scope of those teachings.

Various embodiments of the concepts, systems, devices, structures and techniques sought to be protected are described herein with reference to the related drawings. Alternative embodiments can be devised without departing from the scope of the concepts, systems, devices, structures and techniques described herein. It is noted that various connections and positional relationships (e.g., over, below, adjacent, etc.) are set forth between elements in the following description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration. Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e.

two, three, four, five, etc. The term “connection” can include an indirect “connection” and a direct “connection.”

References in the specification to “one embodiment, “an embodiment,” “an example embodiment,” etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms “upper,” “lower,” “right,” “left,” “vertical,” “horizontal, “top,” “bottom,” and derivatives thereof shall relate to the described structures and methods, as oriented in the drawing figures. The terms “overlying,” “atop,” “on top, “positioned on” or “positioned atop” mean that a first element, such as a first structure, is present on a second element, such as a second structure, where intervening elements such as an interface structure can be present between the first element and the second element. The term “direct contact” means that a first element, such as a first structure, and a second element, such as a second structure, are connected without any intermediary elements.

Use of ordinal terms such as “first,” “second,” “third,” etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms “approximately” and “about” may be used to mean within ±20% of a target value in some embodiments, within ±10% of a target value in some embodiments, within ±5% of a target value in some embodiments, and yet within ±2% of a target value in some embodiments. The terms “approximately” and “about” may include the target value. The term “substantially equal” may be used to refer to values that are within ±20% of one another in some embodiments, within ±10% of one another in some embodiments, within ±5% of one another in some embodiments, and yet within ±2% of one another in some embodiments.

The term “substantially” may be used to refer to values that are within ±20% of a comparative measure in some embodiments, within ±10% in some embodiments, within ±5% in some embodiments, and yet within ±2% in some embodiments. For example, a first direction that is “substantially” perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

What is claimed is:

1. A power transmission gate comprising:

a transistor comprising first, second, third, and fourth terminals with a first one of the terminals corresponding to an input terminal, a second one of the terminals corresponding to an output terminal, a third one of the terminals corresponding to a control terminal, and a fourth one of the terminals corresponding to a body terminal, the transistor configured to receive an input voltage at the input terminal thereof and, in response to a control signal having a first value being provided to the control terminal, pass the input voltage to the output terminal of the transistor, and a first capacitance between the input and control terminals of the transistor and configured to maintain a substantially constant voltage across the input and control terminals of the transistor;

a charge pump configured to apply a drive voltage to the control terminal of the transistor, wherein a voltage level of the drive voltage is larger than a voltage level of the input voltage;

a body control circuit that is configured to control a body of the transistor via the body terminal; and a voltage source selectively coupled to the control terminal of the transistor.

2. The power transmission gate of claim 1, wherein the first terminal of the transistor is a source terminal, the second terminal of the transistor is a drain terminal, the third terminal of the transistor is a gate terminal, and the fourth terminal of the transistor is a body terminal.

3. The power transmission gate of claim 1, wherein:

the voltage source is configured to apply a voltage to the control terminal of the transistor having a value equal to about a maximum possible voltage for the input voltage; and the voltage at the control terminal of the transistor changes proportionally with respect to the input voltage changing between zero volts and the maximum possible voltage for the input voltage.

4. The power transmission gate of claim 2, wherein the charge pump comprises a capacitor that is configured to charge a gate of the transistor to about twice the input voltage.

5. The power transmission gate of claim 4, wherein the charge pump comprises a switch network that is connected to the capacitor.

6. The power transmission gate of claim 5, wherein switches of the switch network are configured to operate at a variable clock frequency.

7. The power transmission gate of claim 6, wherein the variable clock frequency has a relatively high value during an initial turn-on of the transistor, and reduces in value after a particular period of time.

8. The power transmission gate of claim 7, wherein the particular period of time is based on a rate at which the capacitor charges the gate of the transistor.

9. The power transmission gate of claim 5, wherein the switch network is configured to protect a gate-source breakdown voltage of a diode of the charge pump.

10. The power transmission gate of claim 4, wherein the first capacitance has a larger capacitance value than the capacitor.

11. The power transmission gate of claim 1, further comprising a shutdown circuit having a terminal coupled to the control terminal of the transistor and configured to discharge a voltage at the control terminal of the transistor when the transistor is disabled.

12. The power transmission gate of claim 1, wherein the transistor is an NMOS transistor.

13. The power transmission gate of claim 1, wherein the charge pump has a Dickson or Pelliconi topology.

14. The power transmission gate of claim 12, wherein the power transmission gate satisfies one or more safe operating area conditions of the NMOS transistor.

15. The power transmission gate of claim 1, wherein the power transmission gate is a pulse shaping network switch.

16. The power transmission gate of claim 1, wherein the power transmission gate is configured to carry currents in the order of amperes.

17. The power transmission gate of claim 1, wherein the power transmission gate is configured to respond to changes in the input voltage that occur in the order of nanoseconds.

18. The power transmission gate of claim 1, wherein the body control circuit comprises:

a first NMOS transistor that is configured to drive the body of the transistor to a first voltage when the transistor is enabled; and a second NMOS transistor that is configured to drive the body of the transistor to a second voltage different than the first voltage when the transistor is disabled.

19. The power transmission gate of claim 18, wherein the first voltage is the input voltage and the second voltage is a negative supply voltage.

20. A system comprising:

a power transmission gate comprising a transistor comprising first, second, third, and fourth terminals with a first one of the terminals corresponding to an input terminal, a second one of the terminals corresponding to an output terminal, a third one of the terminals corresponding to a control terminal, and a fourth one of the terminals corresponding to a body terminal, the transistor configured to receive an input voltage at the input terminal thereof and, in response to a control signal having a first value being provided to the control terminal, pass the input voltage to the output terminal of the transistor, and a first capacitance between the input and control terminals of the transistor and configured to maintain a substantially constant voltage across the input and control terminals of the transistor, a charge pump configured to apply a drive voltage to the control terminal of the transistor, wherein a voltage level of the drive voltage is larger than a voltage level of the input voltage, and a body control circuit that is configured to control a body of the transistor via the body terminal; and a supply modulator configured to provide, from a set of possible voltage levels, a voltage level to the power transmission gate.

21. The system of claim 20, wherein the supply modulator is configured to provide, from the set of possible voltage levels, the voltage level to at least one additional power transmission gate.

22. The system of claim 21, wherein the power transmission gate is electrically isolated from the at least one additional power transmission gate.

23. A power transmission gate comprising:

a transistor comprising first, second, third, and fourth terminals with a first one of the terminals corresponding to an input terminal, a second one of the terminals corresponding to an output terminal, a third one of the terminals corresponding to a control terminal, and a fourth one of the terminals corresponding to a body terminal, the transistor configured to receive an input voltage at the input terminal thereof and, in response to a control signal having a first value being provided to the control terminal, pass the input voltage to the output terminal of the transistor, and a first capacitance between the input and control terminals of the transistor and configured to maintain a substantially constant voltage across the input and control terminals of the transistor;

a charge pump configured to apply a drive voltage to the control terminal of the transistor, wherein a voltage level of the drive voltage is larger than a voltage level of the input voltage, the charge pump comprising a capacitor configured to charge a gate of the transistor, and a switch network connected to the capacitor, wherein switches of the switch network are configured to operate at a variable clock frequency, the variable clock frequency having a relatively high value during an initial turn-on of the transistor and reducing in value after a particular period of time; and a body control circuit that is configured to control a body of the transistor via the body terminal.

24. The power transmission gate of claim 23, wherein the particular period of time is based on a rate at which the capacitor charges the gate of the transistor.

25. A power transmission gate, comprising:

a transistor comprising first, second, third, and fourth terminals with a first one of the terminals corresponding to an input terminal, a second one of the terminals corresponding to an output terminal, a third one of the terminals corresponding to a control terminal, and a fourth one of the terminals corresponding to a body terminal, the transistor configured to receive an input voltage at the input terminal thereof and, in response to a control signal having a first value being provided to the control terminal, pass the input voltage to the output terminal of the transistor, and a first capacitance between the input and control terminals of the transistor and configured to maintain a substantially constant voltage across the input and control terminals of the transistor;

a charge pump configured to apply a drive voltage to the control terminal of the transistor, wherein a voltage level of the drive voltage is larger than a voltage level of the input voltage, the charge pump comprising a capacitor configured to charge a gate of the transistor, and a switch network connected to the capacitor and configured to protect a gate-source breakdown voltage of a diode of the charge pump; and a body control circuit that is configured to control a body of the transistor via the body terminal.

26. A power transmission gate, comprising:

a transistor comprising first, second, third, and fourth terminals with a first one of the terminals corresponding to an input terminal, a second one of the terminals corresponding to an output terminal, a third one of the terminals corresponding to a control terminal, and a fourth one of the terminals corresponding to a body terminal, the transistor configured to receive an input voltage at the input terminal thereof and, in response to a control signal having a first value being provided to the control terminal, pass the input voltage to the output terminal of the transistor, and a first capacitance between the input and control terminals of the transistor and configured to maintain a substantially constant voltage across the input and control terminals of the transistor;

a charge pump configured to apply a drive voltage to the control terminal of the transistor, the charge pump comprising a capacitor configured to charge a gate of the transistor, wherein a voltage level of the drive voltage is larger than a voltage level of the input voltage, and the first capacitance has a larger capacitance value than the capacitor; and a body control circuit that is configured to control a body of the transistor via the body terminal.

* * * * *